US007593231B2

(12) United States Patent
Kobayashi

(10) Patent No.: US 7,593,231 B2

(45) Date of Patent: Sep. 22, 2009

(54) ADHESIVE SHEET FOR ATTACHING AN ELECTRONIC PART AND AN ELECTRONIC DEVICE HAVING SUCH AN ELECTRONIC PART

(75) Inventor: Kazuhiro Kobayashi, Fujiyoshida (JP)

(73) Assignee: Citizen Electronics Co., Ltd., Yamanashi-Ken (JP)

( * ) Notice: Subject to any disclaimer, the term of this patent is extended or adjusted under 35 U.S.C. 154(b) by 107 days.

(21) Appl. No.: 11/353,817

(22) Filed: Feb. 14, 2006

(65) Prior Publication Data

US 2006/0194001 A1 Aug. 31, 2006

(30) Foreign Application Priority Data

Feb. 16, 2005 (JP) ............................. 2005-039880

(51) Int. Cl.
*H05K 7/20* (2006.01)

(52) U.S. Cl. ....................................... 361/720; 361/760

(58) Field of Classification Search ................. 361/752, 361/790, 797, 800, 760, 741, 720, 736, 748; 174/250–251

See application file for complete search history.

(56) References Cited

U.S. PATENT DOCUMENTS

| | | | | | |
|---|---|---|---|---|---|
| 3,674,109 | A | * | 7/1972 | Murase | 181/170 |
| 3,729,819 | A | * | 5/1973 | Horie | 174/259 |
| 4,167,259 | A | * | 9/1979 | Bury | 248/205.3 |
| 4,461,932 | A | * | 7/1984 | Oyaba | 381/117 |
| 4,626,462 | A | * | 12/1986 | Kober et al. | 428/137 |
| 5,184,344 | A | * | 2/1993 | Takeuchi et al. | 369/126 |

OTHER PUBLICATIONS

Copending U.S. Appl. No. 11/318,959, filed Dec. 27, 2005.
Notification of First Office Action from the Chinese Patent Office, dated Mar. 13, 2009, with translation (11 pages).

* cited by examiner

*Primary Examiner*—Hung S Bui
(74) *Attorney, Agent, or Firm*—Brinks Hofer Gilson & Lione

(57) ABSTRACT

An electronic device includes an element having a surface, an electronic part having a surface to be adhesively attached to the surface of the element, and an adhesive sheet having a first adhesive layer releasably attached to the surface of the element, a second adhesive layer releasably attached to the surface of the electronic part and a third layer adhered between the first adhesive layer and the second adhesive layer. The third layer has an extension which extends outwardly from between the surface and the surface.

5 Claims, 3 Drawing Sheets

ADHESIVE SHEET FOR ATTACHING AN ELECTRONIC PART AND AN ELECTRONIC DEVICE HAVING SUCH AN ELECTRONIC PART

This application claims priority under 35 U.S.C. § 119 to Japanese Patent Application No. 2005-039880 filed Feb. 16, 2005, the entire content of which is hereby incorporated by reference.

FIELD OF THE INVENTION

The present invention relates to techniques for adhesively attaching electronic parts used in the manufacture of electronic devices.

BACKGROUND OF THE INVENTION

In portable acoustic devices such as a cell phone, a double-sided adhesive sheet is employed to attach an exciter to a vibratory speaker plate so that the vibratory speaker plate is vibrated by the exciter (see Japanese patent application publication Nos. H11-331969 and 2001-62396).

FIG. 5 shows one such example wherein an exciter 1 is adhesively attached to a vibratory plate 2 through a double-sided adhesive sheet 3.

The use of such a double-sided adhesive sheet allows ready and economical attachment of electronic parts to their associated elements.

It is desirable that the electronic parts can readily be removed if not properly adhered to their associated elements. A solvent or a sharp knife has conventionally been used to remove the electronic parts. However, such conventional means often cause damages to the electronic parts. The electronic parts, if damaged, can not be reused and must be abandoned.

It is, therefore, an object of the present invention to provide a double-sided adhesive sheet which allows for ready removal of electronic parts.

SUMMARY OF THE INVENTION

According to one aspect of the present invention, there is provided an electronic device including an element having a surface, an electronic part having a surface to be adhesively attached to the surface of the element, and an adhesive sheet including a first adhesive layer releasably attached to the surface of the element, a second adhesive layer releasably attached to the surface of the electronic part and a third layer adhered between the first adhesive layer and the second adhesive layer, wherein the third layer has an extension extending outwardly from between the surface of the element and the surface of the electronic device.

To remove the electronic part, a force is applied in such a direction as to separate the extension of the third layer from the surface of the element. At this time, the force is concentrated on the proximal end of the extension of the third layer between the surface of the electronic part and the surface of the element. This facilitates removal of the surface of the electronic part from the surface of the element.

In one embodiment, the first adhesive layer extends over one side of the extension of the third layer so that the extension of the third layer is attached to the element.

In another embodiment, the second adhesive layer extends over the other side of the extension of the third layer so that the extension of the third layer is attached to the electronic part.

In either embodiment, the extension of the third layer is free from undesirable vibration.

In one embodiment, the element is a vibratory speaker plate, and the electronic part is an exciter which is operable to vibrate the vibratory speaker plate when an electric signal to that effect is received.

According to another aspect of the present invention, there is provided an adhesive sheet for attaching an electronic part to an element.

ADVANTAGES OF THE INVENTION

According to the present invention, the electronic part can readily be removed from the element simply by pulling or lifting the extension of the third layer. The invention avoids damages to the electronic part while it is removed and thus, permits repeated use of the electronic part.

PREFERRED EMBODIMENTS

The present invention will now be described with reference to the accompanying drawings.

Figure 1:
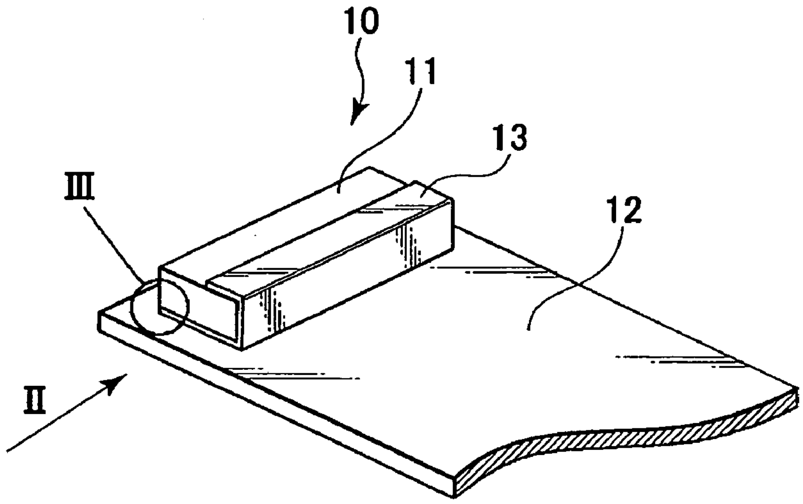
FIG. 1 is a perspective view, partly broken away, of a flat speaker according to one embodiment of the present invention.
Figure 2:
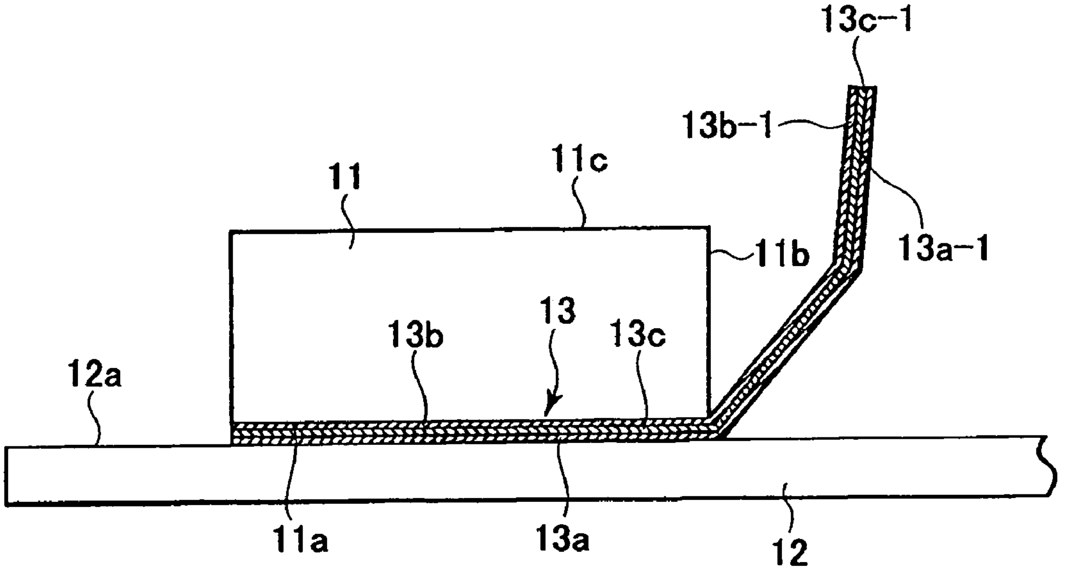
FIG. 2 is a side view of the flat speaker as seen in the direction of the arrow in FIG. 1.
Figure 3:
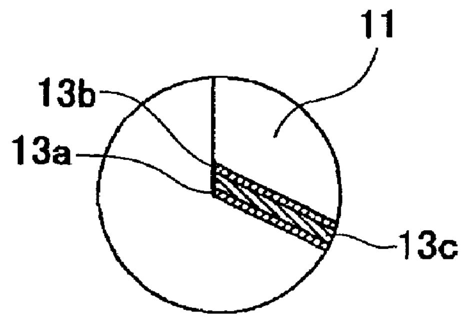
FIG. 3 is an enlarged view of a part of the flat speaker as encircled in FIG. 1.

FIGS. 1 to 3 show a flat speaker 10, as an electronic device, made according to the present invention.

The flat speaker 10 includes a vibratory plate 12 and an exciter 11 adapted to vibrate the vibratory plate 12 upon receipt of an electric signal to that effect.

The exciter 11 is adhered to the vibratory plate 12 by an adhesive sheet 13. As shown best in FIG. 2, the adhesive sheet 13 includes a first adhesive layer 13*a* releasably adhered to a surface 12*a* of the vibratory plate 12, a second adhesive layer 13*b* releasably adhered to a surface 11*a* of the exciter 11, and an intermediate third layer 13*c* disposed between the first adhesive layer 13*a* and the second adhesive layer 13*b* and made, for example, of polyethylene terephthalate. In the illustrated embodiment, the third layer 13*c* has an extension 13*c*-1 projecting outwardly from between the surface 12*a* of the vibratory plate 12 and the surface 11*a* of the exciter 11. Also, the first adhesive layer 13*a* has an extension 13*a*-1 attached to one side of the extension 13*c*-1 of the third layer 13*c*, and the second adhesive layer 13*b* has an extension 13*b*-1 attached to the other side of the extension 13*c*-1 of the third layer 13*c*. As shown in FIG. 1, the extension 13*c*-1 is attached to a side 11*b* and part of an upper surface 11*c* of the exciter 11 through the extension 13*b*-1 of the second adhesive layer 13*b*. This attachment avoids undesirable vibration of the extension 13*c*-1. As an alternative, the extension 13*c*-1 may be attached to the vibratory plate 12 through the extension 1 3*a*-1 of the first adhesive layer 13*a*. The first and second adhesive layers 13*a* and 13*b* may be made of not only a sticky substance, but also a pressure-sensitive adhesive, a temperature-sensitive adhesive and other adhesives.

Figure 4:
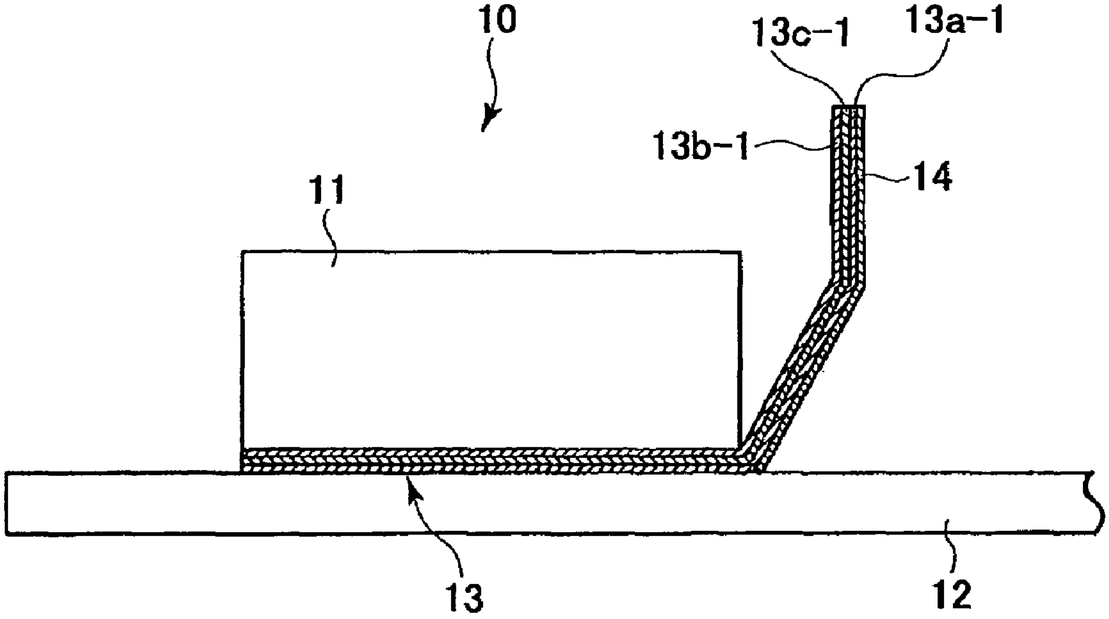
FIG. 4 is a view similar to FIG. 2, but showing another embodiment of the flat speaker according to the present invention.
Figure 5:
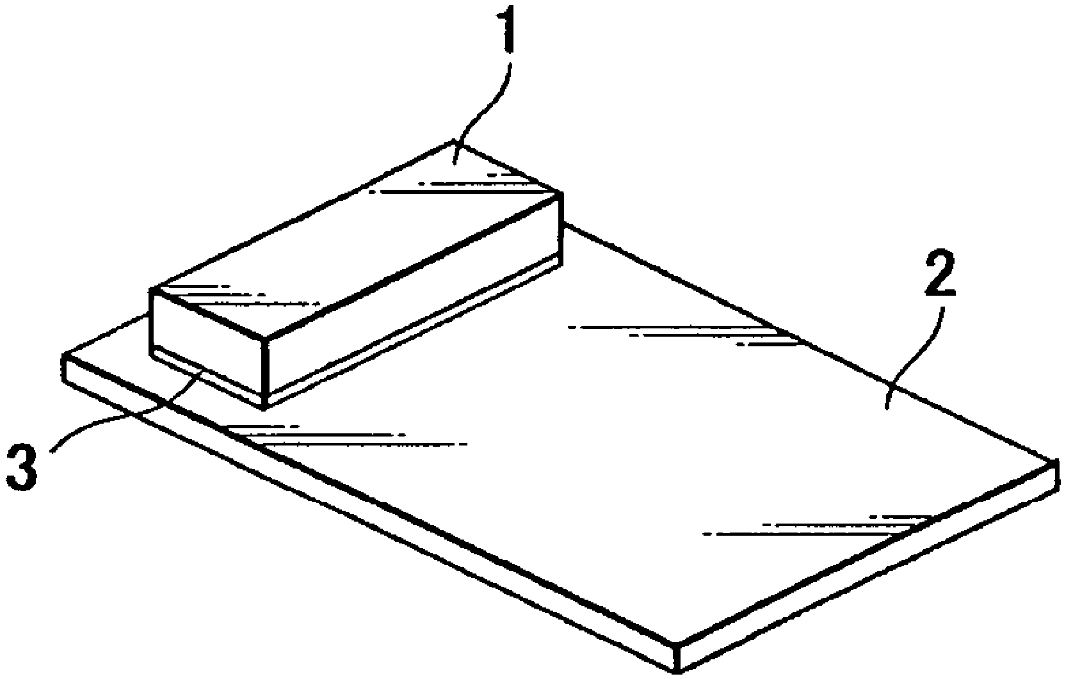
FIG. 5 is a perspective view of a known flat speaker.

FIG. 4 is a side view showing the principal part of a flat speaker according to another embodiment of the present invention.

This speaker differs from the one shown in FIGS. 1 to 3 only in that an additional layer 14 is adhered to the extension 13*a*-1 of the first adhesive layer 13*a*. The additional layer 14 is made, for example, of polyethylene terephthalate. This alternative embodiment has an advantage when the extension 13*a*-1 of the first adhesive layer 13 has a sticky surface.

In use, the extensions of the adhesive sheet 13 are first detached from the exciter 11 or the vibratory plate 12, as shown in FIGS. 2 and 4, by hand or by the use of a tool. The adhesive sheet 13 is then moved away from the vibratory plate 12 so that the exciter 11 is gradually removed from the vibratory plate 12.

For ready identification of the exciter 11, the third layer 13*c* with its extension 13*c*-1 may be pigmented or colored. Alternatively, an identification mark may be printed on the third layer 13 with its extension 13*c*-1.

INDUSTRIAL APPLICABILITY

The present invention is applicable to not only a cell phone and a personal digital assistant (electronic handheld information device), but many other electronic devices as well.

Although the present invention has been described in terms of specific embodiments, it is anticipated that alternations and modifications thereof will no doubt become apparent to those skilled in the art. It is therefore intended that the following claims be interpreted as covering all such alternations and modifications as fall within the true sprit and scope of the invention.

What is claimed is:

1. An electronic device comprising:

an element having a surface;

an electronic part having a surface to be adhesively attached to the surface of the element; and an adhesive sheet including a first adhesive layer releasably attached to the surface of the element, a second adhesive layer releasably attached to the surface of the electronic part, and a third layer adhered between the first adhesive layer and the second adhesive layer, the third layer including an extension extending outwardly from between the surface of the element and the surface of the electronic device, wherein the electronic part is attached to the element via the adhesive sheet;

wherein the extension extends substantially outwardly from an end where the surface of the element and the surface of the electronic part are attached together;

wherein, after the electronic part is attached to the element via the adhesive sheet, the electronic part is detachable from the element by pulling on the extension, wherein the second adhesive layer has an extension attached to one side of the extension of the third layer so that the extension of the third layer is releasably attached to the electronic part;

wherein the electronic part comprises at least a first side and a second side;

wherein the surface of the electronic part that is attached to the element comprises the first side;

wherein the extension of the second adhesive layer extends across at least a part of the second side of the electronic part when the first side of the electronic part and the surface of the element are attached together; and wherein the extension of the third layer is at least as long as the extension of the second adhesive layer so that it extends along at least the part of the second side of the electronic part.

2. The electronic device according to claim 1, wherein the element is a vibratory speaker plate, and the electronic part is an exciter adapted to vibrate the vibratory speaker plate upon receipt of an electric signal.

3. The electronic device according to claim 1, wherein the extension of the second adhesive layer extends across all of the second side of the electronic part; and wherein the extension of the third layer extends across all of the second side of the electronic part.

4. The electronic device according to claim 3, wherein the electronic part comprises at least the first side, the second side, and a third side;

wherein the extension of the second adhesive layer extends across at least a part of the third side of the electronic part; and wherein the extension of third layer extends across at least the part of the third side of the electronic part.

5. The electronic device according to claim 4, wherein the first adhesive layer has an extension attached to an other side of the extension of the third layer, the extension of the first adhesive layer extending across all of the second side of the electronic part and at least a part of the third side of the electronic part.

* * * * *